(12) United States Patent
Horiuchi et al.

(10) Patent No.: US 8,638,542 B2
(45) Date of Patent: Jan. 28, 2014

(54) CAPACITOR CONTAINING A LARGE NUMBER OF FILAMENTOUS CONDUCTORS AND METHOD OF MANUFACTURING THE SAME

(75) Inventors: Michio Horiuchi, Nagano (JP); Yasue Tokutake, Nagano (JP); Yuichi Matsuda, Nagano (JP); Yukio Shimizu, Nagano (JP); Tomoo Yamasaki, Nagano (JP); Yuta Sakaguchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 292 days.

(21) Appl. No.: 12/833,185

(22) Filed: Jul. 9, 2010

(65) Prior Publication Data
US 2011/0013340 A1 Jan. 20, 2011

(30) Foreign Application Priority Data
Jul. 14, 2009 (JP) ................. 2009-165280

(51) Int. Cl.
*H01G 4/06* (2006.01)
*H01G 4/005* (2006.01)
*H01G 7/00* (2006.01)

(52) U.S. Cl.
USPC .................. 361/311; 361/303; 29/25.42

(58) Field of Classification Search
USPC .................. 361/303, 311, 761
See application file for complete search history.

(56) References Cited

U.S. PATENT DOCUMENTS

| | | | | |
|---|---|---|---|---|
| 2,939,059 A * | 5/1960 | Gravley | ................. | 361/321.2 |
| 4,463,084 A | 7/1984 | Mitsumori | | |
| 7,332,231 B2 * | 2/2008 | Ichiyanagi et al. | ........... | 428/631 |
| 7,903,387 B2 * | 3/2011 | Masuda et al. | ................. | 361/303 |
| 8,023,249 B2 * | 9/2011 | Masuda et al. | ................. | 361/303 |
| 8,027,145 B2 * | 9/2011 | Yawata et al. | ................. | 361/303 |
| 8,134,826 B2 * | 3/2012 | Masuda et al. | ................. | 361/312 |
| 2009/0154054 A1 * | 6/2009 | Masuda et al. | ............. | 361/275.1 |

FOREIGN PATENT DOCUMENTS

| | | |
|---|---|---|
| JP | 58-137915 | 8/1983 |
| JP | 58-141595 | 8/1983 |
| JP | 2004-273480 A1 | 9/2004 |
| JP | 2007-150180 A1 | 6/2007 |
| JP | 2009-021553 | 1/2009 |
| JP | 2009-059990 | 3/2009 |
| JP | 2009-147241 A1 | 7/2009 |

OTHER PUBLICATIONS

Machine Translation of JP2004-273480A.*
Machine Translation of JP2009-147241A.*
Notice of Reason for Refusal mailed Jun. 25, 2013 from the Japanese Patent Office in counterpart application No. 2009-165280 with English translation (5 pages).

* cited by examiner

*Primary Examiner* — David M Sinclair
(74) *Attorney, Agent, or Firm* — Kratz, Quintos & Hanson, LLP

(57) ABSTRACT

A capacitor includes a dielectric substrate and a large number of filamentous conductors formed to penetrate through the dielectric substrate in a thickness direction thereof. An electrode is connected to only respective one ends of a plurality of filamentous conductors constituting one of groups each composed of a plurality of filamentous conductors. The electrode is disposed in at least one position on each of both surfaces of the dielectric substrate, or in at least two positions on one of the surfaces. Further, an insulating layer is formed on each of both surfaces of the dielectric substrate so as to cover regions between the electrodes, and a conductor layer is formed on the corresponding insulating layer integrally with a desired number of electrodes.

9 Claims, 8 Drawing Sheets

CAPACITOR CONTAINING A LARGE NUMBER OF FILAMENTOUS CONDUCTORS AND METHOD OF MANUFACTURING THE SAME

CROSS-REFERENCE TO RELATED APPLICATIONS

This application is based on and claims priority of Japanese Patent Application No. 2009-165280 filed on Jul. 14, 2009, the entire contents of which are incorporated herein by reference.

BACKGROUND OF THE INVENTION (a) Field of the Invention

The present invention relates to a capacitor and a method of manufacturing the same. Particularly, it relates to a capacitor which is adapted to be buried into a wiring board on which an electronic component (chip) such as a semiconductor element is to be mounted, and to a method of manufacturing the capacitor.

Since a wiring board having such a capacitor incorporated therein plays a role in mounting of a semiconductor element or the like, the wiring board is also referred to as a "semiconductor package" or simply a "package" for convenience in the description below.

(b) Description of the Related Art

With the demand for further miniaturization and high-density of wirings in a semiconductor package, wiring patterns are further coming closer to each other ever. Accordingly, there may arise problems such as a crosstalk noise occurring among wirings and a fluctuation in the electric potential of a power-supply line or the like. Especially, in a package on which a chip such as an MPU (microprocessor unit) requiring a high-speed switching operation is mounted, a crosstalk noise is likely to occur in accordance with an increase in frequency. In addition, some switching noise occurs when a switching element is turned on and off at a high speed, resulting in the likelihood of fluctuation in the electric potential of a power-supply line or the like. Thus, for the purpose of stabilizing the power-supply voltage and reducing the switching noise and the like, "decoupling" of a power-supply line or the like by implementing a capacitor function in a semiconductor package has been carried out.

A commonly-used method for implementing a capacitor function in a wiring board (package) is to electrically connecting a chip-shaped capacitor component (chip capacitor) to a conductor portion (land or pad) on a board by using a conductive material such as a solder (i.e., the component is surface-mounted). Here, the capacitor component has a multilayer parallel plate structure in which high-dielectric layers are interleaved with electrode layers.

Furthermore, with a recent progressive reduction in the size and thickness of electronic devices, such as mobile and portable devices, techniques for implementing a capacitor function in a board have been put into practical use. For example, there is a technique in which, after a high-permittivity insulating sheet (a sheet of a resin mixed with an inorganic filler for increasing the permittivity) is disposed inside a board, conductor layers (wiring layers) constituting respective electrodes of a capacitor are formed above and below the resin sheet (dielectric) so as to interpose the resin sheet therebetween. There is also a technique in which, after a capacitor formed into a film shape in advance is buried into a board, electrodes of the capacitor are respectively connected to wiring layers located above and below the capacitor.

An example of a technique related to the above-mentioned prior art is described in Japanese Unexamined Patent Publication (Kokai) 2007-150180. In the technique disclosed in this document, a flexible circuit board is manufactured as follows. A wiring pattern is formed on at least one surface of a flexible board. A predetermined material is filled into a groove formed with a predetermined depth and a predetermined pattern shape on the one surface, so that a circuit component integrated with the board is formed. Then, the circuit component is connected to the wiring pattern. As one configuration of the circuit component, a capacitor is formed which includes a pair of comb-shaped electrodes formed by filling an electrode material into grooves formed in comb shapes facing each other, and in which a base material between the pair of comb-shaped electrodes is used as a dielectric layer.

In the conventional art as described above, various techniques have been put into practical use for implementing a capacitor function, which exerts the decoupling effects, in a wiring board (package). In the configuration in which a component (chip capacitor) is surface-mounted on a board, however, the mounting of the component makes it difficult to reduce the thickness of the board.

Further, this configuration poses a problem as follows. Since the chip capacitor is surface-mounted on the board, the route length of wiring laid for connecting the chip capacitor and a power supply or a ground terminal of a semiconductor element mounted on the same board becomes longer depending on the positional relationship between the chip capacitor and the semiconductor element (especially, when the semiconductor element and the chip capacitor are disposed with the board in between). As a result, the inductance is increased to diminish the decoupling effects. Moreover, when a semiconductor element requiring a high-speed switching operation is mounted, a large number of chip capacitors need to be provided to achieve the desired decoupling effect. Accordingly, there also arises a problem in that a process required for mounting the chip capacitors becomes longer.

In the meantime, the configuration in which a capacitor function is implemented in a board has an advantage in terms of the decoupling effect, compared with the configuration in which a chip capacitor is surface-mounted on a board. However, the former configuration has a problem in that it is difficult to obtain a large capacitance due to design restrictions as follows.

Specifically, it is necessary to increase the capacitance of a capacitor in order to effectively allow the desired decoupling effect to function. For example, where opposing areas of electrodes (portions of conductor layers) interposing a dielectric layer in between in a board are increased, the majority of portions of the conductor layers need to be allocated to the electrodes exclusively. Accordingly, the area occupied by the electrodes is increased, and thus there has been an inconvenience that the degree of freedom in design of other wiring patterns on the conductor layers is reduced. As a result, there arises a problem in that it is difficult to incorporate a capacitance structure having a desirably large capacitance into the wiring board.

There is another technique for increasing the opposing areas of electrodes, in which an insulating layer (resin layer) constituting a dielectric and a conductor layer constituting an electrode are alternately stacked with each other. In this technique, it is necessary to stack the layers one by one as in a build-up process. Accordingly, the term required for manufacturing becomes longer, resulting in an increase in the manufacturing cost.

SUMMARY OF THE INVENTION

An object of the present invention is to provide a capacitor which is capable of increasing a capacitance thereof by allowing the capacitance to be easily changed without being restricted by any design, and which can be easily mounted inside a board, and a method of manufacturing the capacitor.

Another object of the present invention is to provide a method of manufacturing a capacitor, which contributes to a reduction in time required for the manufacturing and a reduction in cost.

According to one aspect of the invention, there is provided a capacitor including: a dielectric substrate; a large number of filamentous conductors formed in the dielectric substrate so as to penetrate through the dielectric substrate in a thickness direction thereof; and an electrode connected to only respective one ends of a plurality of filamentous conductors constituting one of groups each composed of a plurality of the filamentous conductors, in which the electrode is disposed in at least one position on each of both surfaces of the dielectric substrate, or in at least two positions on one of the surfaces.

In the configuration of a capacitor according to this aspect, the structure obtained by forming a large number of filamentous conductors in a dielectric substrate so as to penetrate through the dielectric substrate in a thickness direction thereof is used as a dielectric of the capacitor. Additionally, the electrode is disposed in at least one position on each of both surfaces of the dielectric substrate (or in at least two positions on one of the surfaces), and is connected to only respective one ends of a plurality of filamentous conductors constituting one of groups each composed of a plurality of filamentous conductors. In other words, an electrode disposed on one surface of the dielectric substrate and an electrode disposed on the other surface of the dielectric substrate are disposed so as not to face each other (in the case where electrodes are respectively disposed on both surfaces of the board). In the case where electrodes are disposed on only one surface of the board, too, the electrodes are located away from each other.

In this arrangement, one of the electrodes and the plurality of filamentous conductors connected thereto are not electrically connected to the other one of the electrodes and the plurality of filamentous conductors connected thereto, and thus the structure in which capacitive coupling is realized through only the dielectric (dielectric substrate) is achieved. This configuration allows the capacitor capacitance to be easily changed by varying and designing, as necessary, the sizes of the respective electrodes disposed on the dielectric substrate and the relative positions therebetween, thereby making it possible to obtain a required large capacitance without being restricted by any design as encountered in the prior art.

Further, the capacitor has a planar shape, and the board used as the dielectric has a large number of filamentous conductors formed therein in such a way as to penetrate through the board. Accordingly, the two surfaces of the dielectric substrate can be easily connected to each other through the filamentous conductors. Therefore, when the capacitor is buried into a wiring board (package), no such inconvenience as encountered in the prior art occurs in that the degree of freedom in designing other wiring patterns on the conductor layers in the board is decreased. Thus, the capacitor can be easily included in a board.

According to another aspect of the invention, there is provided a method of manufacturing a capacitor, including: forming a plurality of through holes in a dielectric substrate in a thickness direction thereof and then filling the plurality of through holes with metal; forming an insulating layer on each of both surfaces of the dielectric substrate and then forming a via hole at a desired position in the insulating layer, the via hole reaching an end surface of the metal; and forming a conductor layer on the insulating layer inclusive of an inside of the via hole.

The method of manufacturing a capacitor according to this aspect provides the following advantages, in addition to the effects attained by the capacitor according to the above-described aspect. Namely, there is no requirement for a process to stack an insulating layer (dielectric layer) and a conductor layer (electrode) one above the other as has been carried out in the prior art, and therefore, a shorter term for the manufacturing and a lower cost can be achieved.

DESCRIPTION OF THE PREFERRED EMBODIMENTS

Hereinafter, preferred embodiments of the present invention will be described with reference to the attached drawings.

Figure 1:
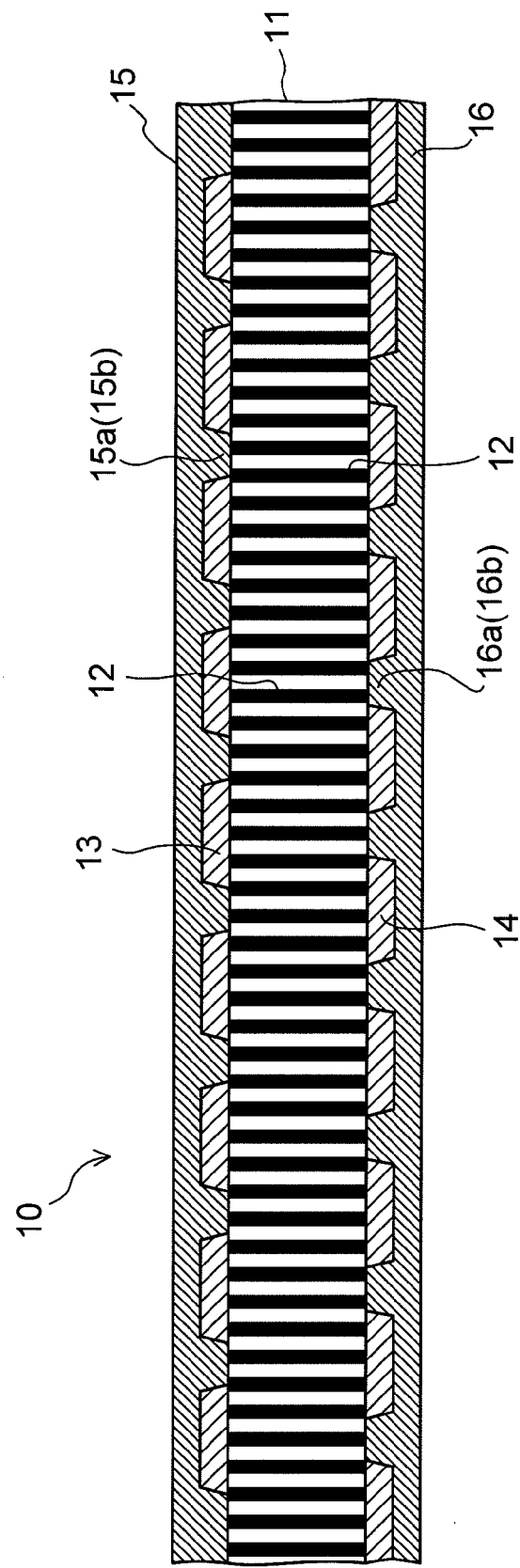
FIG. 1 is a cross-sectional view showing a structure of a capacitor according to a first embodiment of the present invention.

FIG. 1 is a cross-sectional view of a structure of a capacitor according to a first embodiment of the present invention. Although capable of being used as a single product by itself, a capacitor 10 of the present embodiment is basically intended to be used as being buried in a wiring board (package) on which an electronic component (chip) such as a semiconductor element is to be mounted.

The capacitor 10 of the present embodiment has a basic structure including: a dielectric substrate 11 having a desired thickness; and filamentous conductors 12 each having a small diameter, penetrating through the dielectric substrate 11 in a thickness direction thereof, and being disposed densely at predetermined intervals. Specifically, the filamentous conductors 12 are formed in such a way as to expose ends thereof from both surfaces of the dielectric substrate 11, respectively. For the dielectric substrate 11, it is desirable to use a material having a highest possible permittivity, and an inorganic material, such as alumina (aluminum oxide), for example, can be preferably used.

Further, electrodes 15a (15b) and 16a (16b) each formed by a portion of a conductor layer are individually disposed at multiple positions on the respective surfaces of the dielectric substrate 11. The electrodes 15a (15b) and 16a (16b) are each connected to only one ends respectively of multiple filamentous conductors 12 constituting one of groups each composed of multiple filamentous conductors 12. In other words, the electrode 15a (15b) formed on one of the surfaces of the dielectric substrate 11 and the electrode 16a (16b) formed on the other one of the surfaces are disposed so as not to face each other as shown in the drawing. In this arrangement, the electrode 15a (15b) formed on one of the surfaces and the multiple filamentous conductors 12 connected thereto are not electrically connected to the electrode 16a (16b) formed on the other one of the surfaces and the multiple filamentous conductors 12 connected thereto; therefore, a structure is achieved in which capacitive coupling is realized only through the dielectric portion (the dielectric substrate 11).

Figure 2A:
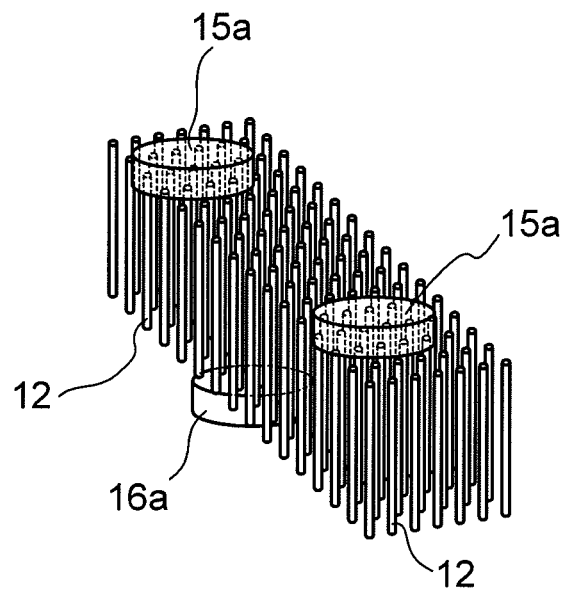
FIGS. 2A and 2B are views schematically showing a configuration of a main portion (filamentous conductors and electrodes connected thereto) of the capacitor in FIG. 1, FIG. 2A being a perspective view of the main portion, and FIG. 2B being a plane view thereof.
Figure 2B:
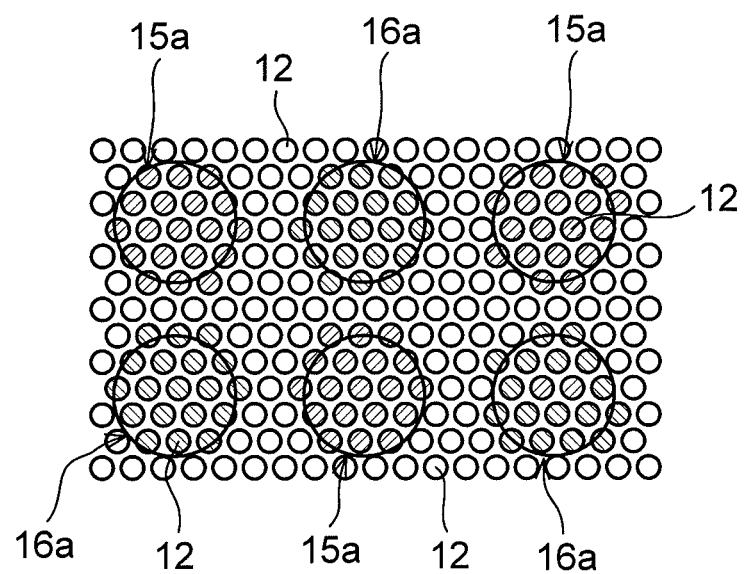
Figure 3A:
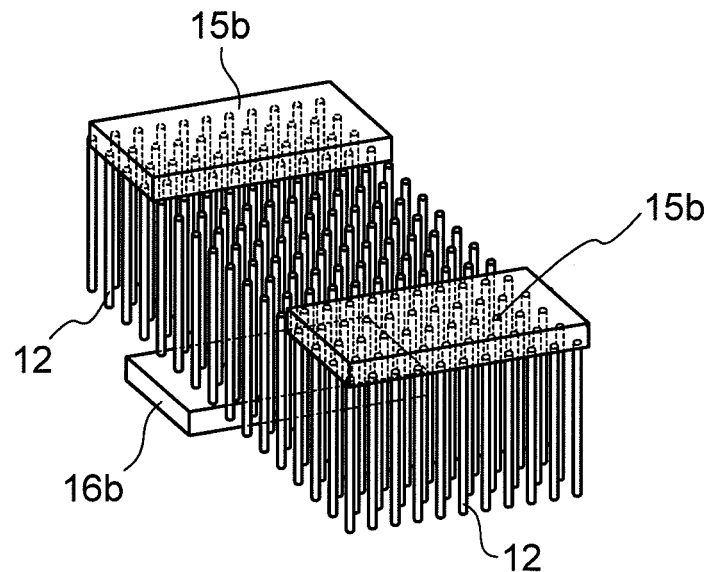
FIGS. 3A and 3B are views schematically showing another configuration of the main portion (filamentous conductors and electrodes connected thereto) of the capacitor in FIG. 1, FIG. 3A being a perspective view of the main portion, and FIG. 3B being a plane view thereof.
Figure 3B:
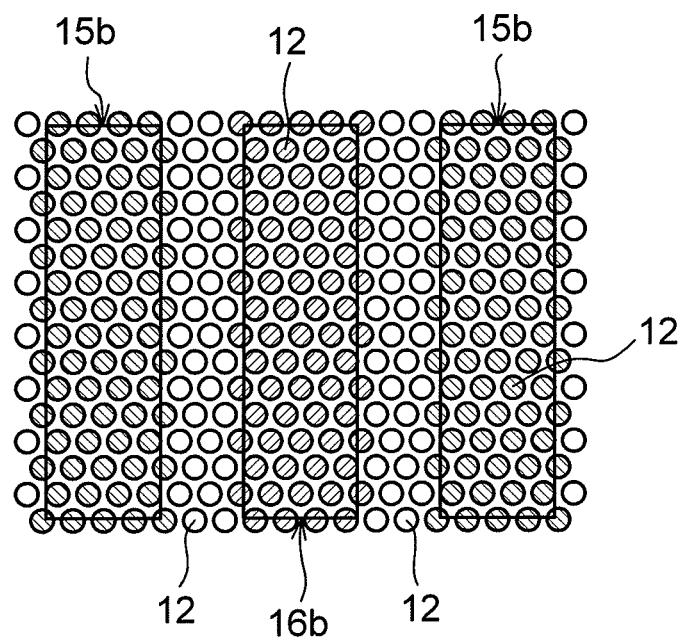

The electrodes 15a (15b) and 16a (16b) are patterned to have a desired shape as to be described below, and are formed at the same time as the formation of the conductor layers. For example, the electrodes 15a and 16a having a "pad shape" as shown in FIGS. 2A and 2B and the electrodes 15b and 16b having a "strip shape" as shown in FIGS. 3A and 3B may be formed.

As shown in FIG. 2A to FIG. 3B, a large number of the filamentous conductors 12 thus provided in the dielectric substrate 11 constitute groups each composed of multiple filamentous conductors 12. The multiple filamentous conductors 12 in the groups are electrically connected to the electrodes 15a, 15b, 16a, and 16b, respectively. Note that, as shown in the drawing, there are some isolated filamentous conductors 12 which are not electrically connected to any of the electrodes 15a, 15b, 16a, and 16b.

The filamentous conductors 12 are formed by filling a metal material into through holes formed in the dielectric substrate 11, which will be described later. Among the filamentous conductors 12 formed in the dielectric substrate 11, those connected to the electrodes 15a, 15b, 16a, and 16b on the surfaces of the board function as a part of a capacitor electrode.

Since the filamentous conductors 12 play an important role as described above, it is desirable that a large number of the filamentous conductors 12 on the average should be included in each of regions in the dielectric substrate 11 which are selected as connecting portions for the signals of the filamentous conductors 12 at the time of designing. Accordingly, the metal filling density in the dielectric substrate 11 needs to be increased as high as possible. For this reason, the filamentous conductors 12 having a small diameter are arranged densely as described above.

In the present embodiment, the filamentous conductors 12 are arranged so that a distance D between each adjacent ones of the filamentous conductors 12 is smaller than the diameter d of each of the filamentous conductors 12 (D<d). Further preferably, the filamentous conductors 12 are each adopted so as to have a diameter d of approximately 30 nm to 1 μm. The arrangement of the filamentous conductors 12 is not particularly limited as long as D<d is satisfied. For example, the filamentous conductors 12 may be arranged in a hexagonal shape or in a grid shape.

Further, insulating layers 13 and 14 are formed on the surfaces of the dielectric substrate 11 so as to cover regions between the electrodes 15a (15b) and between the electrodes 16a (16b), respectively. To be more precise, as will be described later, after the insulating layers 13 and 14 are respectively formed on the surfaces of the dielectric substrate 11, a conductive material is filled into opening portions formed at desired positions in the insulating layers 13 and 14, thereby forming the respective electrodes 15a (15b) and 16a (16b). In this process, conductor layers 15 and 16 are formed at the same time. In other words, the electrodes 15a (15b) and 16a (16b) are formed integrally with the conductor layers 15 and 16, respectively.

Hereinafter, a method of manufacturing the capacitor 10 according to the first embodiment will be described by referring to FIGS. 4A to 4E showing an example of the manufacturing process.

First, in the first step (see FIG. 4A), an alumina (aluminum oxide) green sheet (having a thickness of approximately 70 μm to 100 μm and a size of approximately 100 mm×100 mm) is prepared as the dielectric substrate 11. A large number of through holes TH are formed over the entire sheet in a thickness direction thereof by a puncher or the like. Specifically, the through holes TH are to be filled with the filamentous conductors 12; therefore, the through holes TH are formed densely so as to satisfy the above-described predetermined relationship: D (the distance between each adjacent ones of the filamentous conductors 12)<d (the diameter of each of the filamentous conductors 12).

In the present embodiment, the metal filling density in the dielectric substrate 11 is intended to be highest possible as described above. For this reason, it is desirable to make the diameter d of the filamentous conductor 12 as smallest as possible (preferably, approximately 30 nm to 1 μm). Such a hole (through-hole TH) having a small diameter can be formed by an anodic oxidation method.

For example, prepared is an aluminum (Al) substrate having a surface with an insulation coating. After the surface of the Al substrate is washed, the substrate is immersed into an electrolyte (preferably, an aqueous solution of sulfuric acid). Using the Al substrate as an anode and using a platinum (Pt) electrode disposed so as to face the Al substrate as a cathode, a current is conducted through (a pulse voltage is applied to) the electrolyte. Thereby, a porous metal oxide film (aluminum oxide film having holes each with a small diameter arranged orderly) can be formed on the surface of the Al substrate. Then, a voltage of a reverse potential to that of the anodic oxidation is applied to each of the electrodes (a current is conducted using the Al substrate as a cathode and using the Pt electrode as an anode), Thereby, the porous metal oxide film is separated from the Al substrate. Thus, obtained is the dielectric (alumina) board 11 in which the through holes TH each having a desired small diameter (approximately 30 nm to 1 μm) are formed densely.

In the next step (see FIG. 4B), the filamentous conductors 12 are formed by filling a metal material into the through holes TH formed in the dielectric substrate 11. As the metal material, one having a good conductivity is good enough basically. However, from the viewpoint of availability, processability, and capability to be filled easily by a plating method, copper (Cu) or nickel (Ni) is preferably used.

Alternatively, as another method, by a screen printing method or an ink-jet method using a conductive paste, such as silver (Ag) or copper (Cu), the metal material (Ag, Cu, or the like) can be filled into the through holes TH.

Furthermore, the surfaces of the resultant dielectric substrate 11 may be polished and planarized as needed by mechanical polishing, chemical mechanical polishing (CMP), or the like. Thus, both ends of each of the filamentous conductors 12 are exposed on the respective surfaces of the dielectric substrate 11. Thereby, a structure is manufactured in which a large number of the filamentous conductors 12 are formed in the dielectric substrate 11 in such a way as to penetrate through the dielectric substrate 11 in the thickness direction thereof as illustrated.

In the next step (see FIG. 4C), insulating layers 13A and 14A are formed on the respective surfaces of the structure (the dielectric substrate and the filamentous conductors 12) manufactured in the previous step. An organic resin such as an epoxy resin or a polyimide resin, which is generally employed in a build-up multilayer wiring board, is used as the material of the insulating layers 13A and 14A. Although any of a thermosetting resin and a photosensitive resin can be used as the resin type, a thermosetting epoxy resin is used in the present embodiment. Moreover, the form of the resin is not limited to a liquid, and a resin molded into a film can also be used.

Namely, a thermosetting epoxy resin is coated on both surfaces of the dielectric substrate 11 (including the filamentous conductors 12), or a film of a thermosetting epoxy resin is laminated thereon, and the thermosetting epoxy resin or the film is thermally cured to form the insulating layers 13A and 14A.

In the next step (see FIG. 4D), by a carbon dioxide laser, an excimer laser, or the like, the insulating layers 13A and 14A formed on the respective surfaces of the dielectric substrate 11 (including the filamentous conductors 12) are opened at desired positions to form via holes (openings) OP which reach the dielectric substrate 11 (including the filamentous conductors 12) (formation of the insulating layers 13 and 14). The openings OP are respectively patterned on the shapes of the electrodes to be formed on the surfaces of the dielectric substrate 11 (including the filamentous conductors 12), that is, on desired shapes, such as the shapes of the pad-shaped (strip-shaped) electrodes 15a and 16a (15b and 16b) as illustrated in FIGS. 2A and 2B (FIGS. 3A and 3B).

In the final step (see FIG. 4E), the conductor layers 15 and 16 are formed on the respective surfaces of the dielectric substrate 11 (including the filamentous conductors 12) and on the respective insulating layers 13 and 14 in such a manner that the conductor layers 15 and 16 fill the openings OP formed in the insulating layers 13 and 14. The conductor layers 15 and 16 can be formed as follows, for example.

First, seed layers are formed on the respective surfaces of the dielectric substrate 11 (i.e., on the insulating layers 13 and 14) by sputtering, electroless plating, or the like. For example, titanium (Ti) conductor layers are formed on the surfaces of the dielectric substrate 11 by sputtering in a thickness of approximately 0.1 µm, and copper (Cu) conductor layers are further formed thereon by sputtering in a thickness of approximately 0.5 µm. Thus, formed are the seed layers each having a two-layer structure (Ti/Cu). The Ti layer, which is the lower layer of each seed layer, is a metal layer for enhancing the adhesion between the upper layer (the Cu layer) and the lower layers (the insulating layers 13 and 14 and the dielectric substrate 11). Instead of Ti, chromium (Cr) may be used. Next, the conductor (Cu) layers 15 and 16 each having a desired thickness are formed on the respective seed layers by Cu electroplating using the seed layers as a power supply layer. Among the portions constituting the conductor layers 15 and 16, conductor portions filled into the respective openings OP constitute the electrodes 15a (15b) and 16a (16b) of the capacitor, respectively.

Alternatively, as another method, the conductor layers 15 and 16 having a desired thickness may be formed by a subtractive method, a semi-additive method, or the like after a conductive paste containing a metal, such as Cu, is filled into the openings OP by a screen printing method or the like.

Thus, the following structure, that is, the capacitor 10 of the present embodiment, is manufactured. Specifically, as illustrated, the electrodes 15a (15b) and 16a (16b) are disposed on the respective surfaces of the dielectric substrate 11 (having a large number of the filamentous conductors 12 formed in the dielectric substrate 11 in such a way as to penetrate through the dielectric substrate 11 in a thickness direction thereof) in such a manner that the electrodes 15a (15b) and 16a (16b) are each connected to only one ends respectively of multiple filamentous conductors 12 constituting one group; the insulating layers 13 and 14 are formed to cover the regions between the electrodes 15a (15b) and between the electrodes 16a (16b), respectively; and the conductor layers 15 and 16 integral with the electrodes 15a (15b) and 16a (16b) are further formed on the insulating layers 13 and 14, respectively.

As described above, in the capacitor 10 (FIG. 1) and the method of manufacturing the same (FIGS. 4A to 4E) according to the present embodiment, the structure (FIG. 4B), which is obtained by densely forming the filamentous conductors 12 having a small diameter in such a way as to penetrate through the dielectric substrate 11 in a thickness direction thereof, is used as a dielectric of the capacitor 10; and the electrodes 15a (15b) and 16a (16b), which are each connected to only one ends respectively of multiple filamentous conductors 12 constituting one group, are disposed at desired positions on the respective surfaces of the dielectric substrate 11. In other words, the electrodes 15a (15b) formed on one surface of the dielectric substrate 11 and the electrodes 16a (16b) formed on the other surface are disposed in such a way not to face each other. Therefore, a structure is achieved in which capacitive coupling is realized only through the dielectric portion (dielectric substrate 11).

In this structure, the capacitor capacitance can be easily changed by changing the sizes and relative positions of the electrodes (15a, 15b, 16a, and 16b) disposed on the surfaces of the dielectric substrate 11 as necessary. Accordingly, the structure is capable of providing a required large capacitance (the structure is adaptable to a capacitor with a larger capacitance) without receiving the design restrictions as seen in the prior art.

Further, the capacitor 10 is a planar shape, and the board 11 used as a dielectric has a large number of the filamentous conductors 12 formed in such a way as to penetrate through the board 11. Accordingly, the surfaces of the dielectric substrate 11 can be easily connected to each other through the filamentous conductors 12. Therefore, when this capacitor 10 is buried into a wiring board (package), no such inconvenience as seen in the prior art occurs that the degree of freedom in designing other wiring patterns on the conductor layers in the board is reduced. Thus, the capacitor 10 can be easily included in a board.

Further, the capacitor 10 does not require a process of stacking an insulating layer (dielectric layer) and a conductor layer (electrode) alternately with each other, which has been carried out in the prior art, as means for increasing a capacitor capacitance; thus, a shorter manufacturing lead time and a lower cost can be achieved.

In the first embodiment described above, the description has been given by taking the example where the electrode 15a (15b) formed on one surface of the dielectric substrate 11 (having a large number of filamentous conductors 12 formed in such a way as to penetrate through the dielectric substrate 11 in a thickness direction thereof) and the conductor layer 15 connected to the electrode 15a (15b) are used as one terminal of the capacitor 10 while the electrode 16a (16b) formed on the other surface and the conductor layer 16 connected to the electrode 16a (16b) are used as the other terminal of the capacitor 10. However, it is needless to say that the configuration of the terminals of the capacitor is not limited thereto, as apparent from the gist of the present invention (the capacitor capacitance can be easily changed (the capacitor can have a larger capacitance) by changing and designing as necessary the sizes and the relative positions of the capacitor electrodes disposed on the surfaces of the dielectric substrate, and the capacitor can be buried into the board easily).

Figure 5:
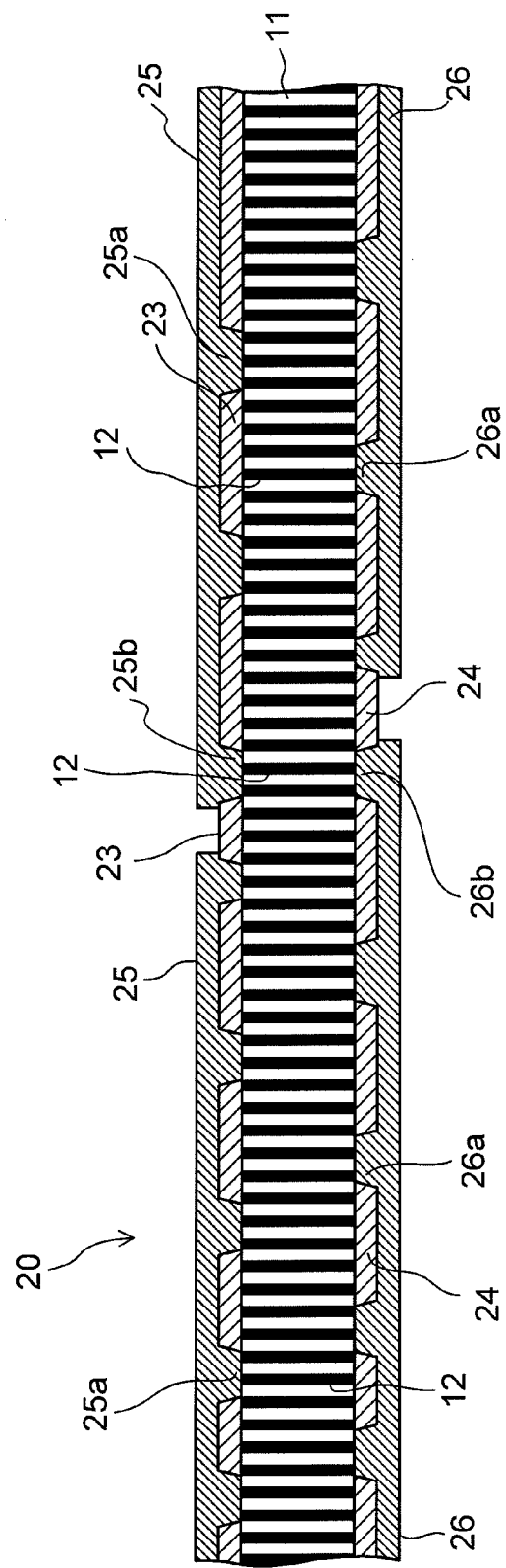
FIG. 5 is a cross-sectional view showing a structure of a capacitor according to a second embodiment of the present invention.

FIG. 5 is a cross-sectional view showing a structure of a capacitor according to a second embodiment of the present invention.

A capacitor 20 (FIG. 5) of the present embodiment is different from the capacitor 10 (FIG. 1) of the first embodiment in terms of arrangements with respect to the following points: conductor layers 25 and 26 formed respectively on both surfaces of the capacitor 20 are each divided into two conductor layer regions in the illustrated example; insulating layers 23 and 24 respectively formed on the surfaces of the dielectric substrate 11 are exposed at portions where the conductor layers 25 and 26 are each divided into the two conductor layer regions; and an electrode 25b out of multiple electrodes 25a and 25b concurrently connected to the conductor layer 25 and an electrode 26b out of multiple electrodes 26a and 26b concurrently connected to the conductor layer 26 are disposed so as to face each other with the dielectric substrate 11 in between, and are electrically connected through multiple filamentous conductors 12. Other arrangements are the same as those in the first embodiment; thus, the description thereof will be omitted.

Basically, the capacitor 20 of the second embodiment can be manufactured in processes similar to the processes (FIGS. 4A to 4E) in the first embodiment. However, due to the above-described differences in the arrangements, slightly different treatment is carried out in the related processes.

Figure 4A:
FIGS. 4A to 4E are cross-sectional views showing an example of a manufacturing process of the capacitor in FIG. 1.
Figure 4B:
Figure 4C:
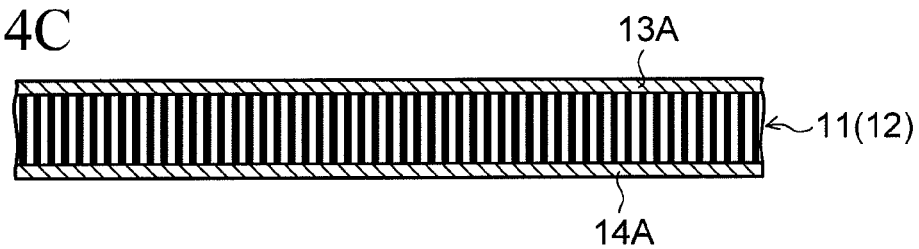
Figure 4D:
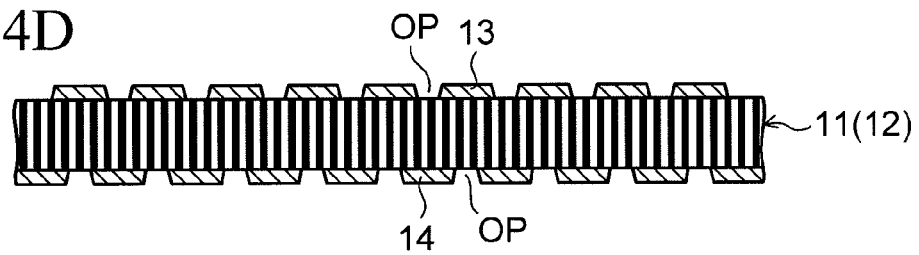

First, in the step in FIG. 4D, when the insulating layers 23 and 24 each having openings are respectively formed on the surfaces of the dielectric substrate 11 (having the filamentous conductors 12 densely formed in such a way as to penetrate through the dielectric substrate 11 in a thickness direction thereof), the shapes and positions of the openings are different. Specifically, the openings to be formed in the insulating layers 23 and 24 are basically patterned on the shapes of the electrodes 25a, 25b, 26a, and 26b, respectively, to be formed on the surfaces of the dielectric substrate 11, as in the case of the first embodiment. However, the electrodes 25b and 26b are patterned to face each other with the dielectric substrate 11 in between as shown in FIG. 5.

Figure 4E:
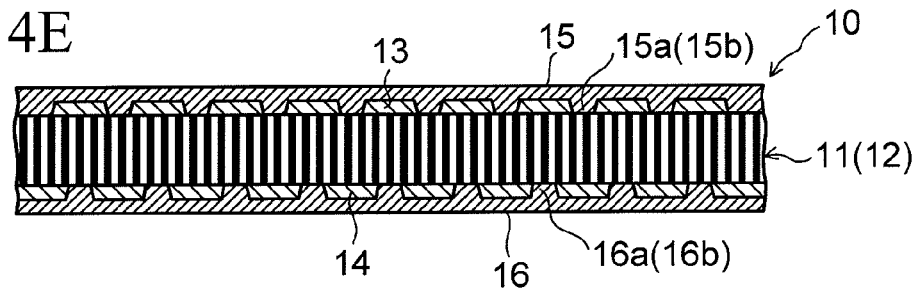

Then, in the step in FIG. 4E, the conductor layers 25 and 26 are respectively formed on the surfaces of the dielectric substrate 11 and the insulating layers 23 and 24 in such a way to be each divided into two conductor layer regions (i.e., in such a way that the insulating layers 23 and 24 are exposed at the portions where the conductor layers 25 and 26 are divided).

In the structure of the capacitor 20 according to this second embodiment, there are advantages as follows in addition to the effects attained in the first embodiment (FIG. 1). Specifically, the electrode 25b connected to the conductor layer 25 formed on one surface and the electrode 26b connected to the conductor layer 26 formed on the other surface are electrically connected through the multiple filamentous conductors 12 inside the dielectric substrate 11. Accordingly, when the conductor layer 25 (or 26) formed on one side of the board 11 is used as a power-supply layer, the relative position thereof to the opposing conductor layer (ground layer) can be switched. In other words, the multiple filamentous conductors 12 interposed between the electrodes 25b and 26b which face each other function as a kind of conductor via.

Therefore, when this capacitor 20 is used while buried in a wiring board (package), wirings (power-supply line, ground line, and signal line) can be laid out between the top and bottom of the capacitor 20 with the capacitor 20 in between. Specifically, while the capacitor 20 capable of exerting desired decoupling effects is included inside a board, wirings can be easily laid out between the top and bottom of the board by using the conductor layers 25 and 26 formed on the surfaces of the capacitor 20, respectively.

Figure 6:
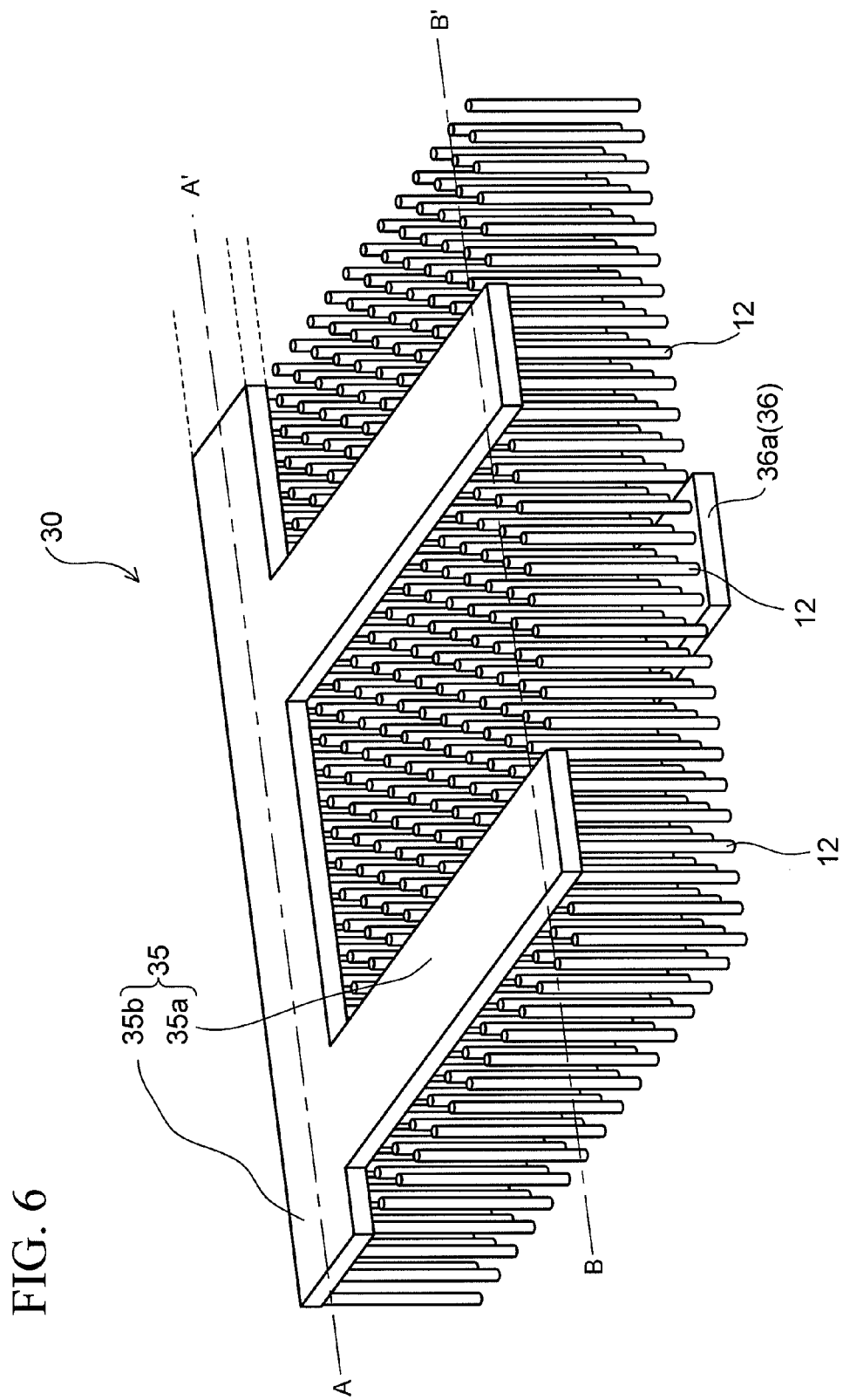
FIG. 6 is a perspective view schematically showing a configuration of a main portion (filamentous conductors and electrodes connected thereto) of a capacitor according to a third embodiment of the present invention.
Figure 7A:
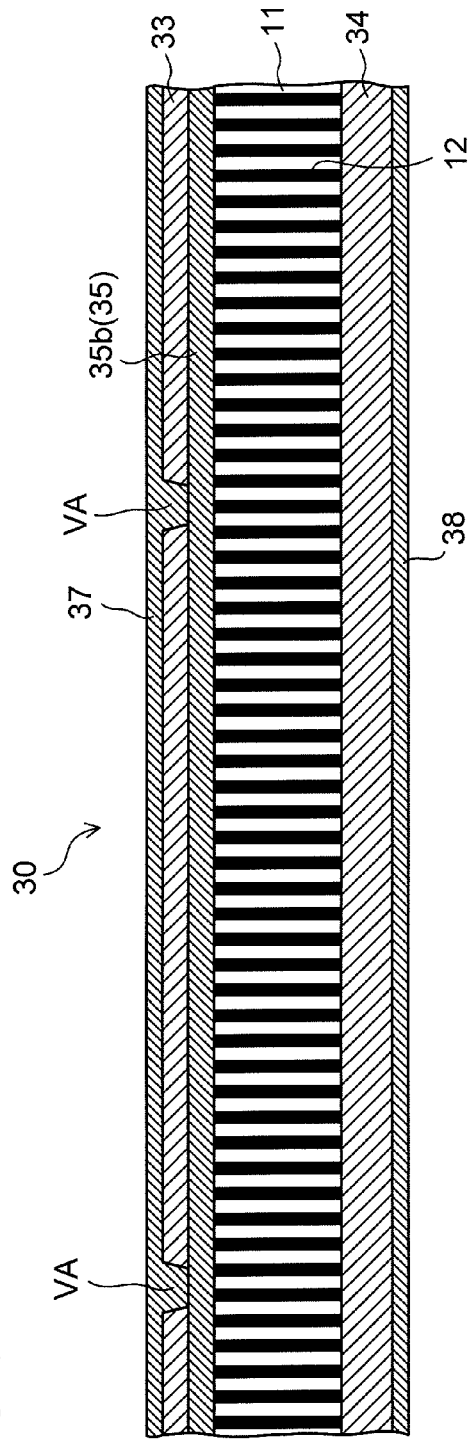
FIGS. 7A and 7B are cross-sectional views showing a structure of the capacitor according to the third embodiment of the present invention, showing cross-sectional structures taken along the line A-A' and the line B-B' in FIG. 6, respectively.
Figure 7B:
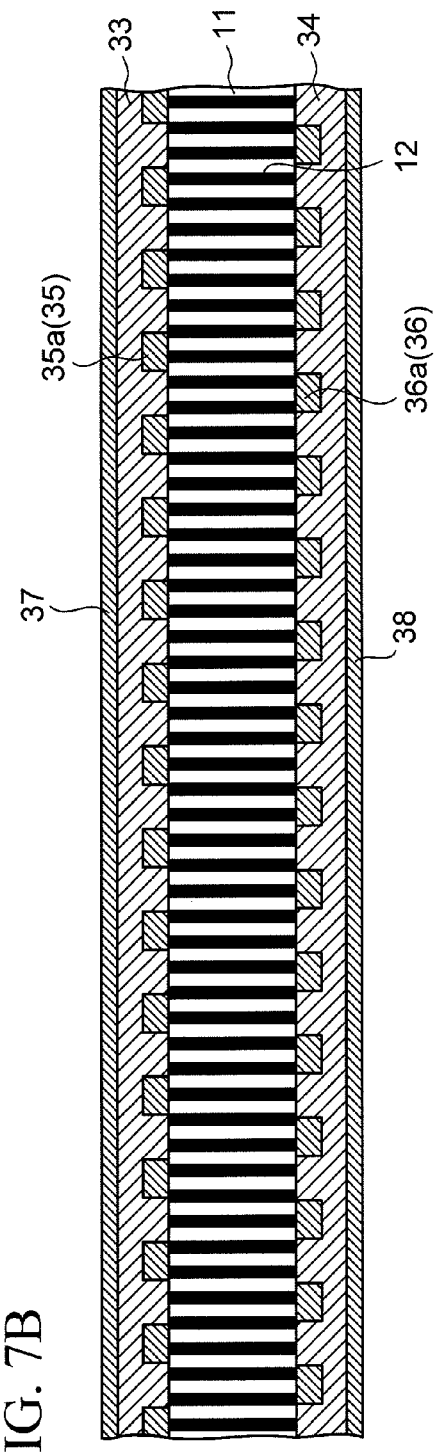

FIG. 6 is a perspective view schematically showing a configuration of a main portion (the filamentous conductors 12 and electrodes 35 and 36 connected thereto) of a capacitor 30 according to a third embodiment of the present invention. FIGS. 7A and 7B show a structure of the capacitor 30, and are views showing cross-sectional structures taken along the line A-A' and the line B-B' in FIG. 6, respectively.

The capacitor 30 (FIGS. 7A and 7B) of the present embodiment is different from the capacitor 10 (FIG. 1) of the first embodiment in terms of arrangements with respect to the following points: the electrodes 35 and 36 to be disposed respectively on both surfaces of the dielectric substrate 11 (having the filamentous conductors 12 formed in such a way as to penetrate through the dielectric substrate 11 in a thickness direction thereof) are formed to have a comb-pattern shape; the electrodes 35 and 36 respectively include narrow line portions (comb-tooth portions) 35a and 36a, which extend parallel to each other, and wiring portions (connecting portions) (note that only the wiring portion of the electrode 35 is shown and denoted by reference numeral 35b, but the wiring portion of the electrode 36 is not shown in the drawing), which are orthogonally connected to the narrow line portions 35a and 36a; insulating layers 33 and 34 are formed on the surfaces of the dielectric substrate 11 so as to cover the electrodes 35 and 36, respectively; conductor layers 37 and 38 are formed respectively on the insulating layers 33 and 34; and the conductor layers 37 and 38 are connected to the wiring portions of the electrodes 35 and 36 (note that only the wiring portion of the electrode 35 is shown and denoted by reference numeral 35b, but the wiring portion of the electrode 36 is not shown in the drawing) through conductor vias formed at desired positions in the insulating layers 33 and 34 (note that only the conductor via of the insulating layer 33 is shown and denoted by VA but the conductor vias of the insulating layer 34 are not shown in the drawing), respectively. Other arrangements are basically the same as those in the first embodiment; thus, the description thereof will be omitted.

In the third embodiment, it is intended that the electrode 35 formed on one surface of the dielectric substrate 11 is used as one of electrodes (terminals) of the capacitor 30 while the electrode 36 formed on the other surface is used as the other one of the electrodes (terminals) of the capacitor 30. For this reason, the electrode 35 on one surface and the electrode 36 on the other surface are disposed so as not to face each other. In other words, multiple filamentous conductors 12 each having one end connected to the electrode 35 are not electrically connected to multiple filamentous conductors 12 each having one end connected to the other electrode 36, and capacitive coupling is achieved only through the dielectric portion (the dielectric substrate 11). In addition to the multiple filamentous conductors 12 connected to the electrodes 35 and 36, there are also isolated filamentous conductors 12 which are not electrically connected to either the electrodes 35 or 36.

Basically, the capacitor 30 of the third embodiment can also be manufactured in processes similar to the processes (FIGS. 4A to 4E) in the first embodiment. However, due to the above-described differences in the arrangements, slightly different treatment is carried out in the related processes.

First, after the steps in FIGS. 4A and 4B, the electrodes 35 and 36 which are each patterned on a desired comb shape are formed on the surfaces of the dielectric substrate 11 (having the filamentous conductors 12 densely formed so as to penetrate through the dielectric substrate 11 in a thickness direction thereof), respectively. Next, in a similar manner as of the processing performed in the process in FIG. 4C, the insulating layers 33 and 34 are formed on the surfaces of the dielectric substrate 11 so as to cover the electrodes 35 and 36, respectively. Further, via holes are formed by a laser or the like at desired positions on the respective insulating layers 33 and 34. Then, the conductor layers 37 and 38 are respectively formed on the insulating layers 33 and 34 by filling the via holes by a plating or the like (formation of the vias VA).

In the configuration of the capacitor 30 according to the third embodiment, aside from that the electrodes 35 and 36 respectively formed on the surfaces of the dielectric substrate 11 (having the filamentous conductors 12 formed in such a way as to penetrate through the dielectric substrate 11 in a thickness direction thereof) have different shapes, the basic principle is the same as that of the first embodiment (FIG. 1). Accordingly, similar effects to the effects obtained in the first embodiment (FIG. 1) can be attained.

Incidentally, in the configuration of the capacitor 30 according to the third embodiment (FIG. 7), the wiring portions of the electrodes 35 and 36 (only the wiring portion 35b is shown, but the wiring portion of the electrode 36 is omitted from the drawing) are respectively connected to the conductor layers 37 and 38 through the conductor vias formed in the insulating layers 33 and 34 formed above the wiring portions (only the conductor vias VA are shown, but the conductor vias in the insulating layer 34 are omitted from the drawing). However, the conductor vias VA are not necessarily required for the purpose of allowing the capacitor 30 to exert its function. Specifically, these conductor vias VA are needed for the capacitor 30 buried in a wiring board (package) when the top and bottom of the capacitor 30 is electrically connected through the conductor layers 37 and 38.

Figure 8:
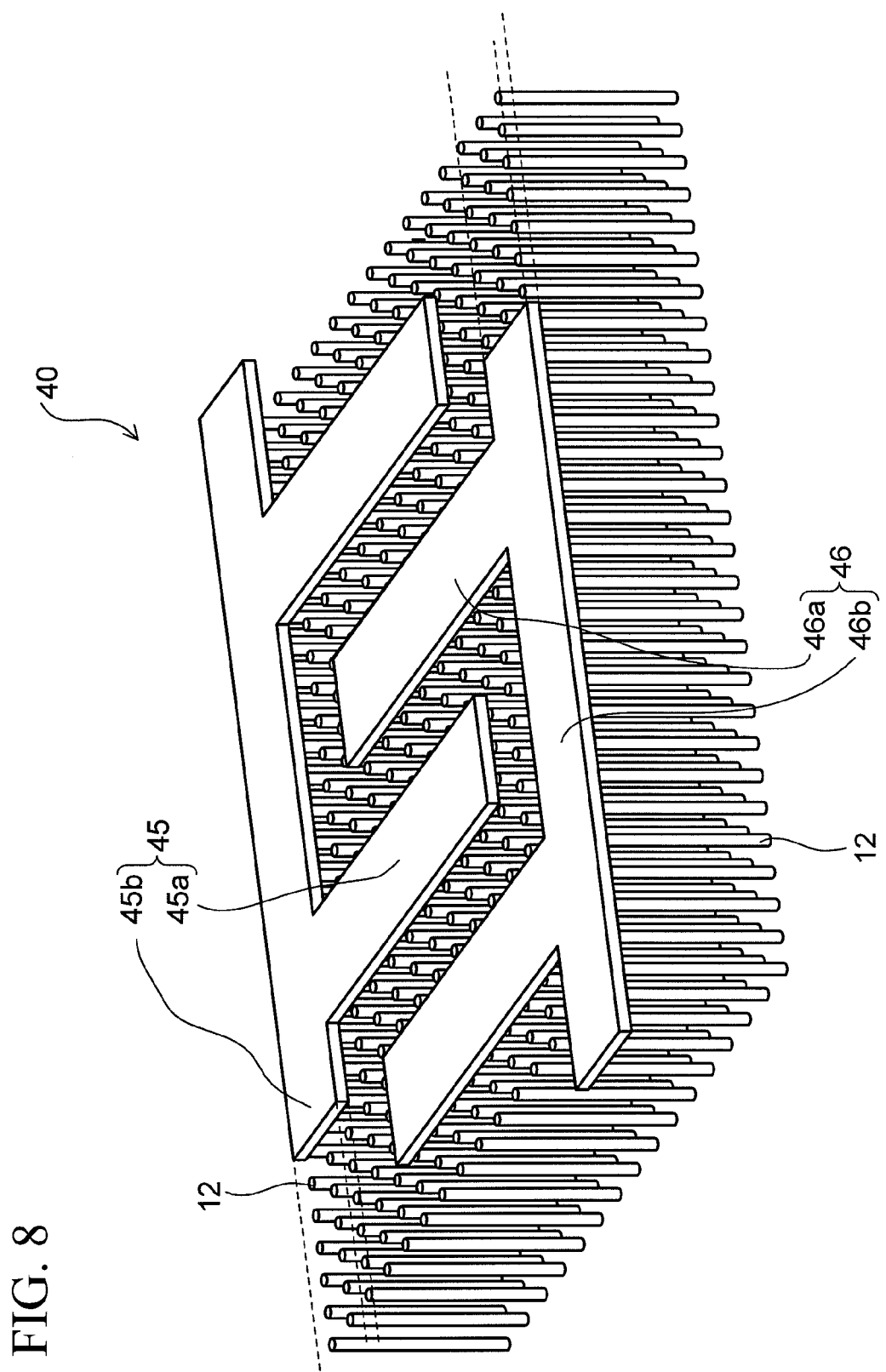
FIG. 8 is a perspective view schematically showing a configuration of a main portion (filamentous conductors and electrodes connected thereto) of a capacitor according to a fourth embodiment of the present invention.

FIG. 8 is a perspective view schematically showing a configuration of a main portion (the filamentous conductors 12 and electrodes 45 and 46 connected thereto) of a capacitor 40 according to a fourth embodiment of the present invention.

The capacitor 40 (FIG. 8) of the present embodiment is different from the capacitor 30 (FIG. 6) of the third embodiment in terms of the arrangements with respect to the point that the comb-shaped electrode 45 constituting one electrode (terminal) of the capacitor 40 and the comb-shaped electrode 46 constituting the other electrode (terminal) of the capacitor 40 are disposed on the same surface of the dielectric substrate 11 (having the filamentous conductors 12 formed in such a way as to penetrate through the dielectric substrate 11 in a thickness direction thereof) so as to face each other. Similarly to the case of the third embodiment (electrodes 35 and 36), the electrodes 45 and 46 respectively include narrow line portions (comb-tooth portions) 45a and 46a, which extend parallel to each other, and wiring portions (connecting portions) 45b and 46b, which are orthogonally connected to the narrow line portions 45a and 46b. The comb-tooth portions 45a and 46a of the respective electrodes 45 and 46 are disposed so as to be parallel to each other with a distance therebetween.

Other arrangements are basically the same as those in the case of the third embodiment. Specifically, the capacitor 40 of the fourth embodiment also has a configuration in which: insulating layers (equivalent to the insulating layers 33 and 34 in FIG. 7) are formed on the surfaces of the dielectric substrate 11 to coat over the electrodes 45 and 46, respectively; a conductor layer (equivalent to the conductor layer 37 in FIG. 7) is formed on the insulating layer where the electrodes 45 and 46 are formed; and the conductor layer is connected to corresponding one of the wiring portions 45b and 46b of the electrodes 45 and 46, respectively, through a conductor via (equivalent to the conductor via VA in FIG. 7) formed at a desired position of the insulating layer.

Further, in the capacitor 40 of the fourth embodiment, one electrode 45 and the other electrode 46 are also disposed so as not to overlap each other. By having this structure, a capacitive coupling between the multiple filamentous conductors 12 connected to one electrode 45 and the multiple filamentous conductors 12 connected to the other electrode 46 is achieved only through a dielectric portion (dielectric substrate 11). Further, there are also isolated filamentous conductors 12 which are not electrically connected to any one of the electrodes 45 and 46, in addition to the multiple filamentous conductors 12 connected to the electrodes 45 and 46.

Basically, the capacitor 40 according to the fourth embodiment can be manufactured in processes similar to the above-described processes in the third embodiment. Therefore, description thereof will be omitted.

In the configuration of the capacitor 40 of the fourth embodiment, the basic principle is the same as that of the third embodiment (FIG. 6 to FIG. 7B) although the arrangements of the electrodes 45 and 46 are different. Accordingly, as in the case of the third embodiment, similar effects to the effects obtained in the first embodiment (FIG. 1) can be attained.

In the embodiments described above, the description has been given by taking the example where alumina (aluminum oxide) is used as the material constituting the dielectric substrate 11. However, it is needless to say that the material for the board is not limited thereto. Specifically, as apparent from the gist of the present invention, the bottom line is, it is sufficient if the dielectric substrate 11 is formed of a material having a highest possible permittivity. Examples of other materials which can be preferably used include titanium oxide, aluminum nitride, and ceramics (inorganic materials), such as mullite. When mullite is used, it is slightly inferior to alumina in terms of permittivity (the permittivity of alumina is approximately 8 to 10 whereas the permittivity of mullite is 6.5) but has an advantage in terms of achieving a higher speed of signal propagation. Accordingly, mullite is especially useful when this capacitor is buried for use in a package including a chip component requiring a high-speed switching operation.

Further, as other materials, inorganic materials, such as metal oxides having a perovskite-type structure, including BST (barium strontium titanate), BTO (barium titanate), STO (strontium titanate), PZT (piezoelectric zirconate titanate), and the like, can also be used.

What is claimed is:
1. A capacitor, comprising:
 a dielectric substrate;
 a large number of filamentous conductors formed in the dielectric substrate so as to penetrate through the dielectric substrate in a thickness direction thereof, the large number of filamentous conductors constituting groups each composed of a plurality of filamentous conductors; and a plurality of electrodes each connected to only one ends of the plurality of filamentous conductors of each group, wherein, the plurality of filamentous conductors, having the plurality of electrodes connected to only one ends thereof, has an insulating layer connected to another end thereof, wherein among the groups respectively connected to the electrodes, any two groups next to each other are of capacitance, wherein among the plurality of electrodes two electrodes respectively connected to the any two groups next to each other are disposed on respective surfaces of both surfaces of the dielectric substrate so as to not face each other, or at two positions on one surface of the both surfaces, and wherein the large number of filamentous conductors includes isolated filamentous conductors not electrically connected to the electrodes, the isolated filamentous conductors being disposed between the groups next to each other.

2. The capacitor according to claim 1, wherein the electrode is disposed in a plurality of positions on each of both surfaces of the dielectric substrate, and further comprising an insulating layer formed on each of both surfaces of the dielectric substrate so as to cover regions between the electrodes, and a conductor layer formed on the corresponding insulating layer integrally with a desired number of electrodes.

3. The capacitor according to claim 2, further comprising a pair of electrodes disposed on the dielectric substrate so as to face each other and electrically connected respectively to both ends of a plurality of filamentous conductors so as to share the filamentous conductors, wherein a wiring connection is established between one surface and the other surface of the dielectric substrate via the pair of electrodes.

4. The capacitor according to claim 1, wherein the electrode is composed of a plurality of comb-tooth portions extending parallel to each other and a connection portion connected perpendicularly to the comb-tooth portions.

5. The capacitor according to claim 4, further comprising an insulating layer formed on the dielectric substrate so as to cover the electrode, and a conductor layer formed on the insulating layer, wherein the conductor layer is connected to the connection portion of the electrode through a conductor via formed in the insulating layer.

6. The capacitor according to claim 1, wherein the large number of filamentous conductors in the dielectric substrate are disposed in such a manner that a distance between each adjacent ones of the filamentous conductors is smaller than a diameter of each of the filamentous conductors.

7. The capacitor according to claim 1, wherein the dielectric substrate includes a signal line, a power-supply line, and a ground line, wherein the power-supply line and the ground line are of capacitance.

8. A method of manufacturing a capacitor, comprising:

forming a large number of through holes in a dielectric substrate in a thickness direction thereof and then filling the large number of through holes with metal to form a large number of filamentous conductors, the large number of filamentous conductors constituting groups each composed of a plurality of filamentous conductors;

forming a plurality of electrodes each connected to only one ends of the plurality of filamentous conductors of each group, wherein among the groups respectively connected to the plurality of electrode, any two groups next to each other are of capacitance, and wherein among the plurality of electrodes two electrodes respectively connected to the any two groups next to each other are disposed on respective surfaces of both surfaces of the dielectric substrate so as to not face each other, or at two positions on one surface of the both surfaces;

forming insulating layers on respective surfaces of both surfaces of the dielectric substrate and then forming via holes at desired positions in the insulating layers, the via holes reaching the electrodes; and forming conductor layers on the insulating layers inclusive of insides of the via holes, wherein the large number of filamentous conductors includes isolated filamentous conductors not electrically connected to the electrodes, the isolated filamentous conductors disposed between the groups next to each other.

9. The capacitor according to claim 8, wherein the dielectric substrate includes a signal line, a power-supply line, and a ground line, wherein the power-supply line and the ground line are of capacitance.

* * * * *